(12) United States Patent
Reichardt et al.

(10) Patent No.: US 10,647,900 B2
(45) Date of Patent: May 12, 2020

(54) CHEMICAL-MECHANICAL POLISHING COMPOSITION COMPRISING BENZOTRIAZOLE DERIVATIVES AS CORROSION INHIBITORS

(71) Applicant: BASF SE, Ludwigshafen (DE)

(72) Inventors: Robert Reichardt, Mannheim (DE); Martin Kaller, Mannheim (DE); Michael Lauter, Mannheim (DE); Yuzhuo Li; Andreas Klipp, Lambsheim (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/905,703

(22) PCT Filed: Jul. 1, 2014

(86) PCT No.: PCT/IB2014/062747
§ 371 (c)(1),
(2) Date: Jan. 15, 2016

(87) PCT Pub. No.: WO2015/004567
PCT Pub. Date: Jan. 15, 2015

(65) Prior Publication Data
US 2016/0200943 A1    Jul. 14, 2016

(30) Foreign Application Priority Data

Jul. 11, 2013 (EP) .................................. 13176221

(51) Int. Cl.
*C09G 1/00* (2006.01)
*C09G 1/02* (2006.01)
(Continued)

(52) U.S. Cl.
CPC .............. *C09K 3/1463* (2013.01); *C09G 1/02* (2013.01); *C09K 3/14* (2013.01); *C09K 3/1454* (2013.01);
(Continued)

(58) Field of Classification Search
None
See application file for complete search history.

(56) References Cited

U.S. PATENT DOCUMENTS

| 4,744,950 A | 5/1988 | Hollander |
| 5,874,026 A | 2/1999 | Pilsits, Jr. et al. |

(Continued)

FOREIGN PATENT DOCUMENTS

| CA | 747619 | 12/1966 |
| CN | 1280606 A | 1/2001 |

(Continued)

OTHER PUBLICATIONS

International Search Report dated Mar. 27, 2015 in PCT/IB14/62747 Filed Jul. 1, 2014.

*Primary Examiner* — Stephanie P Duclair
(74) *Attorney, Agent, or Firm* — Oblon, McClelland, Maier & Neustadt, L.L.P.

(57) ABSTRACT

A chemical-mechanical polishing (CMP) composition is provided comprising (A) one or more compounds selected from the group of benzotriazole derivatives which act as corrosion inhibitors and (B) inorganic particles, organic particles, or a composite or mixture thereof. The invention also relates to the use of certain compounds selected from the group of benzotriazole derivatives as corrosion inhibitors, especially for increasing the selectivity of a chemical mechanical polishing (CMP) composition for the removal of (Continued)

Figure 1:
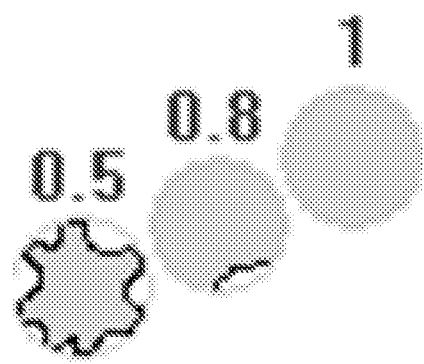

tantalum or tantalum nitride from a substrate for the manufacture of a semiconductor device in the presence of copper on said substrate.

16 Claims, 2 Drawing Sheets

(51) Int. Cl.
*C09G 1/04* (2006.01)
*C09K 3/14* (2006.01)
*H01L 21/02* (2006.01)
*H01L 21/304* (2006.01)
*H01L 21/306* (2006.01)
*H01L 21/321* (2006.01)
*H01L 21/461* (2006.01)

(52) U.S. Cl.
CPC ...... *H01L 21/304* (2013.01); *H01L 21/30625* (2013.01); *H01L 21/3212* (2013.01); *H01L 21/461* (2013.01)

(56) References Cited

U.S. PATENT DOCUMENTS

| | | | |
|---|---|---|---|
| 6,565,619 B1 | 5/2003 | Asano et al. | |
| 6,821,309 B2 | 11/2004 | Singh et al. | |
| 8,084,362 B2 | 12/2011 | Amanokura et al. | |
| 8,084,363 B2 | 12/2011 | Amanokura et al. | |
| 8,481,428 B2 | 7/2013 | Amanokura et al. | |
| 2003/0228763 A1* | 12/2003 | Schroeder | H01L 21/3212 438/691 |
| 2005/0050803 A1 | 3/2005 | Amanokura et al. | |
| 2005/0076578 A1 | 4/2005 | Siddiqui et al. | |
| 2005/0090104 A1 | 4/2005 | Yang et al. | |
| 2006/0075688 A1* | 4/2006 | Takenouchi | C09G 1/02 51/307 |
| 2006/0118760 A1 | 6/2006 | Yang et al. | |
| 2007/0004210 A1 | 1/2007 | Takemiya et al. | |
| 2007/0082456 A1 | 4/2007 | Uotani et al. | |
| 2007/0128872 A1 | 6/2007 | Itoh et al. | |
| 2007/0181534 A1* | 8/2007 | Kamimura | B24B 37/044 216/88 |
| 2008/0067077 A1 | 3/2008 | Kodera et al. | |
| 2008/0105652 A1 | 5/2008 | Brusic et al. | |
| 2009/0311864 A1 | 12/2009 | Yamada et al. | |
| 2010/0323522 A1 | 12/2010 | Takemiya et al. | |
| 2010/0323584 A1* | 12/2010 | Haga | C09G 1/02 451/36 |
| 2011/0008065 A1 | 1/2011 | Yanagihara | |
| 2011/0008965 A1 | 1/2011 | Takemiya et al. | |
| 2011/0100956 A1* | 5/2011 | Keleher | C09G 1/02 216/37 |
| 2011/0180511 A1* | 7/2011 | Akatsuka | C09G 1/02 216/83 |
| 2011/0203186 A1* | 8/2011 | Oshima | B24B 37/044 51/298 |
| 2014/0014872 A1* | 1/2014 | Tamada | C09G 1/02 252/79.1 |
| 2015/0218709 A1* | 8/2015 | Yoshizaki | C09G 1/02 252/79.2 |

FOREIGN PATENT DOCUMENTS

| | | |
|---|---|---|
| CN | 101535442 A | 9/2009 |
| EP | 2 605 270 | 6/2013 |
| WO | 2004/063301 A1 | 7/2004 |
| WO | 2006/058504 A1 | 6/2006 |
| WO | 2014038391 * | 8/2013 |

* cited by examiner

CHEMICAL-MECHANICAL POLISHING COMPOSITION COMPRISING BENZOTRIAZOLE DERIVATIVES AS CORROSION INHIBITORS

FIELD OF THE INVENTION

The present invention relates to a chemical-mechanical polishing composition comprising one or more specific benzotriazole (BTA) derivatives, as well as to the use of said specific benzotriazole derivatives as corrosion inhibitor and/or as additive for increasing the selectivity of a chemical mechanical polishing (CMP) composition. The present invention also relates to corresponding processes for the manufacture of a semiconductor device comprising chemical mechanical polishing of a substrate in the presence of a CMP composition.

DESCRIPTION OF THE PRIOR ART

In the semiconductor industry, chemical mechanical polishing is a well-known technology applied in fabricating advanced photonic, microelectromechanical, and microelectronic materials and devices, such as semiconductor wafers.

During the fabrication of materials and devices used in the semiconductor industry, chemical-mechanical polishing (CMP) is employed to planarize metal and/or oxide surfaces. CMP utilizes the interplay of chemical and mechanical action to increase the planarity of the to-be-polished surfaces. Chemical as well as mechanical action is provided by a chemical-mechanical polishing composition, also referred to as a CMP composition or a CMP slurry. Polishing action is usually carried out by a polishing pad which is typically pressed onto the to-be-polished surface and mounted on a moving platen. The movement of the platen is usually linear, rotational or orbital. In a typical CMP process step, a rotating wafer holder brings the to-be-polished wafer in contact with a polishing pad. The CMP composition is usually applied between the to-be-polished wafer and the polishing pad.

In many cases it is desired that chemical-mechanical polishing, as described above, is conducted with a high selectivity with respect to a particular layer or material being removed by the polishing/planarization process. When CMP is performed with high selectivity, the removal rate of the selected material or layer is significantly higher than that of other material(s) or layer(s) exposed at the surface of the work piece being polished.

Copper (Cu) and Cu-base alloys (the symbol Cu as used in the present disclosure refers to high purity elemental copper and the expression "Cu-base alloy" refers to an alloy containing at least 80 wt.-% copper) are often used as metal interconnect materials. However, when Cu or Cu-base alloys are used for metallization it is generally necessary to provide a diffusion barrier between the Cu or Cu-base alloy metallization feature and the adjacent thin layers of dielectric insulation material (interlayer dielectric (ILD) or intermetal dielectric (IMD). Currently, tantalum (Ta)-containing layers, e.g. elemental Ta and tantalum nitride (TaN), are most commonly employed for these barrier purposes.

In the production chain of a semiconductor device, barrier chemical-mechanical polishing (Barrier CMP) is employed in order to remove barrier layers (TaN, TiN, Ta, Ti, etc.). This process step is ideally conducted so that the barrier materials are removed without damaging the wafer surface, the conducting wire (Cu or Cu base alloy, see above) or the dielectric insulation material, see above.

During CMP steps, and in particular during Barrier CMP, depending on the wafer stack, attempts have been made to polish different layers at desired rate and selectivity to get the desired defect free surface. See e.g. US2009/0311864A1 and US2005/0076578A1.

CMP compositions are known which comprise a corrosion inhibitor in order to control the corrosion of the surface of metal. Typically, such a corrosion inhibitor adheres to the surface to be polished to form a protective film. Benzotriazole (BTA) and certain BTA derivatives are known as corrosion inhibitors, see US 2009/0311864 A1 as well as "Chemical Mechanical Planarization of Microelectronic Materials (Joseph M. Steigerwald, Shyam P. Murarka, Ronald J. Gutmann), Wiley-VCH, 2008.

The following documents disclose specific benzotriazole derivatives: US 2008/0105652 A1, US 2008/0067077 A1, US 2007/0128872 A1, US 2007/0082456 A1, US 2005/0090104 A1, U.S. Pat. No. 6,821,309 B2, U.S. Pat. No. 6,565,619 B1.

OBJECTS OF THE INVENTION

One of the objects of the present invention is to provide a chemical-mechanical polishing (CMP) composition suitable for use in a process for the chemical-mechanical polishing (CMP) of substrates used in the semiconductor industry, particularly for the chemical-mechanical polishing of substrates comprising
(1) copper or a copper alloy, and/or
(2) tantalum, tantalum nitride, titanium, titanium nitride, ruthenium, cobalt, or alloys thereof.

More particularly, the chemical-mechanical polishing (CMP) composition to be provided should have an effect on the ratio of the removal rate of a first metal or alloy to the removal rate of a second metal or alloy, and even more particularly, if copper and tantalum are present in the substrate, on the ratio of the removal rate of tantalum (or tantalum alloy) to the removal rate of copper (or copper alloy) during CMP processing. According to a related aspect, it was an object of the present invention to provide a CMP composition appropriate for the chemical-mechanical polishing of substrates used in the semiconductor industry which provides a high removal rate of tantalum (preferably in combination with a high selectivity for removal of tantalum in relation to copper) during CMP processing of substrates comprising copper and tantalum. The CMP composition to be provided should preferably have a low material removal rate (MRR) of the material not to be removed in the CMP process, for example copper and/or low k material in contrast to tantalum.

Furthermore, the CMP composition should be a stable formulation or dispersion where no phase separation should occur.

As far as barrier layers and low-k or ultra-low-k materials are present in the semiconductor substrate used, the CMP composition of the invention should preferably remove the barrier layers and maintain the integrity of the low-k and ultra-low-k materials, i.e. it should have a particularly high selectivity for barrier layer over low-k or ultra-low-k materials with regard to the M RRs. Particularly, as far as copper layers, barrier layers and low-k or ultra-low-k materials are present in the substrate to be polished, the CMP composition of the invention should show the combination of as many as possible of the following properties: (a) high MRR of barrier layer, (b) low MRR of copper layer, (c) low MRR of low-k or ultra-low-k materials, (d) high selectivity for barrier layer over copper layer with regard to MRR, (e) high selectivity for barrier layer over low-k and ultra-low-k materials with regard to MRR. Most particularly, as far as copper layers, tantalum or tantalum nitride layers and low-k or ultra-low-k materials are present in the substrate to be polished, the CMP composition of the invention should show the combination of as many as possible of the following properties: (a') high MRR of tantalum or tantalum nitride, (b') low MRR of copper layer, (c') low MRR of low-k or ultra-low-k materials, (d') high selectivity for tantalum or tantalum nitride over copper with regard to MRR, and (e') high selectivity for tantalum or tantalum nitride over low-k or ultra-low-k materials with regard to MRR.

Furthermore, the CMP composition of the invention should show a long shelf life, while high MRR of barrier layer is maintained.

A related object of the invention is to provide a process for the manufacture of a semiconductor device comprising chemical mechanical polishing of a substrate, particularly of a substrate comprising a tantalum layer and/or a copper layer.

A further object of the invention is to provide corrosion inhibitors, especially for increasing the selectivity of a chemical mechanical polishing (CMP) composition for the removal of tantalum from a substrate for the manufacture of a semiconductor device in the presence of copper on said substrate.

SUMMARY OF THE INVENTION

According to a first aspect of the present invention, a chemical-mechanical polishing (CMP) composition is provided comprising
(A) one or more compounds of formula (1)

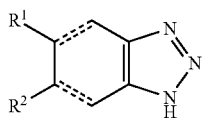

wherein the pairs of dashed lines in formula (1) either each represent a double bond or each represent a single bond
wherein
(i) when each pair of dashed lines in formula (1) represents a double bond
one of $R^1$ and $R^2$ is hydrogen and the other of $R^1$ and $R^2$ is selected from the group consisting of chlorine, bromine, alkyl with three to six carbon atoms, benzoyl and —$COOR^3$ wherein $R^3$ is selected from the group consisting of alkyls with three to six carbon atoms or $R^3$ is a substituent comprising a structural unit selected from the group consisting of —($CH_2$—$CH_2$—O)$_n$—H and —($CH_2$—$CH_2$—O)$_n$—$CH_3$, wherein n in each case is an integer in the range of from 1 to 15
or
$R^1$ and $R^2$ are both independently selected from the group consisting of bromine and chlorine
and
(ii) when each pair of dashed lines in formula (1) represents a single bond
$R^1$ and $R^2$ are hydrogen
or one of $R^1$ and $R^2$ is hydrogen and the other of $R^1$ and $R^2$ is selected from the group consisting of chlorine, bromine, alkyl with three to six carbon atoms, benzoyl and —$COOR^3$ wherein $R^3$ is selected from the group consisting of alkyls with three to six carbon atoms or $R^3$ is a substituent comprising a structural unit selected from the group consisting of —($CH_2$—$CH_2$—O)$_n$—H and —($CH_2$—$CH_2$—O)$_n$—$CH_3$ wherein n in each case is an integer in the range of from 1 to 15
or
$R^1$ and $R^2$ are both independently selected from the group consisting of bromine and chlorine
(B) inorganic particles, organic particles, or a composite or mixture thereof,
wherein the total amount of cations selected from the group consisting of magnesium and calcium is less than 1 ppm based on the total weight of the respective CMP composition.

When each pair of dashed lines in formula (1) represents a double bond, the six membered ring in formula (1) is in the aromatic state.

When $R^1$ is alkyl it is preferred that said alkyl is selected from the group consisting of tert-butyl and sec-butyl.

When none of $R^1$ and $R^2$ is hydrogen it is preferred that both $R^1$ and $R^2$ are bromine.

When $R^1$ or $R^2$ is —$COOR^3$ wherein $R^3$ is a substituent comprising a structural unit selected from the group consisting of —($CH_2$—$CH_2$—O)$_n$—H and —($CH_2$—$CH_2$—O)$_n$—$CH_3$, wherein n in each case is an integer in the range of from 1 to 15 $R^3$ preferably is an ethoxylate residue or a methyl-terminated ethoxylate residue. An ethoxylate residue is a substituent of the structure —($CH_2$—$CH_2$—O)$_n$—H. A methyl-terminated ethoxylate residue is a substituent of the structure —($CH_2$—$CH_2$—O)$_n$—$CH_3$. In each case n is an integer selected in the range of from 1 to 15.

It is known that benzotriazole irrespective of the presence of substituents on the benzene ring is subject to tautomerism, i.e., chemical equilibrium between molecular forms differing with regard to the position of the hydrogen atom on the triazole ring (1H, 2H and 3H). In the solid state and in solution, the 1H-tautomer of benzotriazole is the predominant species [Advances in Heterocyclic Chemistry, Volume 76, 2000, 157-323], while the concentration of the 2H-tautomeric form is negligible [J. Phys. Chem. A, Vol. 111, No. 28, 2007]. However, especially in aqueous solution, the 1H and 3H tautomers are in rapid equilibrium [Tetrahedron. Vol. 25, 1667-4670, 1969; J. Phys. Chem. A, Vol. 111, No. 28, 2007]. These findings also hold true for substituted benzotriazoles where an equilibrium mixture of 1H and 3H tautomers is present as well [Magn. Reson. Chem. 2009, 47, 142-148]. Therefore, in the context of the present application, for each compound of formula (1) mentioned hereinbelow, all of the respective tautomeric forms (1H, 2H, 3H) are included.

Preferably the one or at least one of the more than one compounds of formula (1) of constituent (A) of the CMP composition of the present invention is selected from the group consisting of
5-bromo-1H-benzotriazole,
5-tert-butyl-1H-benzotriazole,
5-(benzoyl)-1H-benzotriazole,
5,6-dibromo-1H-benzotriazole,
5-chloro-1H-benzotriazole,
5-sec-butyl-1H-benzotriazole,
4,5,6,7-tetrahydro-1H-benzotriazole.

For certain applications the use of 5-chloro-1H-benzotriazole in a CMP composition of the present invention is slightly less preferred than the use of the other compounds of this group.

Typically, due to tautomerism the benzotriazole derivatives which are substituted in the 5-position are present in chemical equilibrium with the corresponding benzotriazole derivative substituted in the 6-position.

According to a further aspect of the invention, a process is provided for the manufacture of a semiconductor device comprising chemical mechanical polishing of a substrate in the presence of a chemical mechanical polishing (CMP) composition as defined hereinabove and hereinbelow. With respect to preferred CMP compositions for use in the process of the invention see below.

In a further aspect, the present invention relates to the use of a compound of the formula (1)

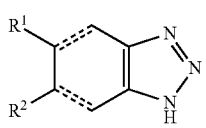

(1)

wherein the pairs of dashed lines in formula (1) either each represent a double bond or each represent a single bond wherein
(i) when each pair of dashed lines in formula (1) represents a double bond
   one of $R^1$ and $R^2$ is hydrogen and the other of $R^1$ and $R^2$ is selected from the group consisting of bromine, alkyl with three to six carbon atoms, benzoyl and —$COOR^3$ wherein $R^3$ is selected from the group consisting of alkyls with three to six carbon atoms or $R^3$ is a substituent comprising a structural unit selected from the group consisting of —$(CH_2$—$CH_2$—$O)_n$—H and —$(CH_2$—$CH_2$—$O)_n$—$CH_3$, wherein n in each case is an integer in the range of from 1 to 15
   or
   $R^1$ and $R^2$ are both independently selected from the group consisting of bromine and chlorine
and
(ii) when each pair of dashed lines in formula (1) represents a single bond
   $R^1$ and $R^2$ are hydrogen
   or
   one of $R^1$ and $R^2$ is hydrogen and the other of $R^1$ and $R^2$ is selected from the group consisting of chlorine, bromine, alkyl with three to six carbon atoms, benzoyl and —$COOR^3$ wherein $R^3$ is selected from the group consisting of alkyls with three to six carbon atoms or $R^3$ is a substituent comprising a structural unit selected from the group consisting of —$(CH_2$—$CH_2$—$O)_n$—H and —$(CH_2$—$CH_2$—$O)_n$—$CH_3$, wherein n in each case is an integer in the range of from 1 to 15
   or
   $R^1$ and $R^2$ are both independently selected from the group consisting of bromine and chlorine
as corrosion inhibitor, especially for increasing the selectivity of a chemical mechanical polishing (CMP) composition for the removal of tantalum or tantalum nitride from a substrate for the manufacture of a semiconductor device in the presence of copper on said substrate.

Constituent (A): Corrosion Inhibitor

The compound of formula (1) as defined above acts as a corrosion inhibitor. It is presently believed that the compound of formula (1) can act as corrosion inhibitor by forming a protective molecular layer on the surface of a metal, e.g. copper. Surprisingly it has now been found that the compounds of formula (1) in contrast to the compound benzotriazole (BTA) and in contrast to other derivatives of BTA used in the prior art CMP compositions have an advantageous effect on the selectivity of the removal of tantalum or tantalum nitride versus the removal of copper, when the compound of formula (1) is a constituent of a chemical-mechanical polishing (CMP) composition used for polishing of a substrate comprising both tantalum or tantalum nitride and copper. Furthermore, a compound of formula (1) used as a constituent of a chemical-mechanical polishing (CMP) composition positively influences the removal rate of tantalum or tantalum nitride. Thus, in a typical chemical-mechanical polishing (CMP) composition comprising a compound of formula (1) as an active constituent a high removal rate for tantalum or tantalum nitride is accomplished, and at the same time a high selectivity of the removal of tantalum or tantalum nitride versus the removal of copper.

Generally, constituent (A), i.e. the total amount of compound(s) of formula (1) can be contained in any of a broad range of proportions in the CMP composition of the present invention. Preferably, the total amount of constituent (A) is not more than 1 wt. % (wt. % means "percent by weight"), more preferably not more than 0.5 wt. %, most preferably not more than 0.1 wt. %, particularly not more than 0.05 wt. %, for example not more than 0.025 wt. %, based in each case on the total weight of the respective CMP composition of the present invention. Preferably, the total amount of constituent (A) is at least 0.0001 wt. %, more preferably at least 0.0005 wt. %, most preferably at least 0.001 wt. %, particularly at least 0.005 wt. %, for example at least 0.01 wt. %, based in each case on the total weight of the respective CMP composition of the present invention.

A chemical-mechanical polishing (CMP) composition according to the invention comprises constituents (A) and (B) as defined above and explained hereinbelow in further detail. Preferably, a chemical-mechanical polishing (CMP) composition according to the invention further comprises constituent (C) as defined and explained hereinbelow in further detail. More preferably, a chemical-mechanical polishing (CMP) composition according to the invention, preferably a chemical-mechanical polishing (CMP) composition according to the invention characterized herein as preferred comprises one, two three or all of constituents (C), (D), (E) and (F) as defined and explained hereinbelow in further detail. In certain preferred embodiments, a chemical-mechanical polishing (CMP) composition according to the invention, preferably a chemical-mechanical polishing (CMP) composition according to the invention characterized herein as preferred, further comprises one, more than one or all of constituents (G), (H), (I) and (J) as defined and explained hereinbelow in further detail.

The substances used in or as the above-mentioned constituents (B), (C), (D), (E), (F), (G), (H), (I) and (J) of a chemical-mechanical composition of the present invention are not compounds of formula (1) used in or as constituent (A) of a chemical-mechanical composition of the present invention as defined hereinabove and hereinbelow.

It is noted that for quantitative considerations any substances which are not compounds of formula (1) and which because of their structure at the same time fall under the definition of various (i.e. two or more) constituents selected from the group consisting of constituents (B), (C), (D), (E), (F), (G), (H), (I) and (J) of the respective CMP composition according to the invention must be assigned in each case to each of these various constituents.

In addition to the above-mentioned constituents the chemical-mechanical polishing (CMP) composition of the present invention may contain water. Typically, the water present in a chemical-mechanical polishing (CMP) composition of the present invention together with other constituents forms an aqueous phase. If present said water is not considered as belonging to any constituent selected from the group consisting of constituents (B), (C), (D), (E), (F), (G), (H), (I) and (J) of the respective CMP composition according to the invention.

Constituent (B): Particles

In particular, a CMP composition according to the invention comprises as constituent (B) inorganic particles, organic particles or a composite or mixture thereof. Constituent (B) itself can be constituted of
- one type of inorganic particles,
- a mixture or composite of different types of inorganic particles,
- one type of organic particles,
- a mixture or composite of different types of organic particles, or
- a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, constituent (B), i.e. the total amount of particles of constituent (B), can be contained in any of a broad range of proportions in the CMP composition of the present invention. Preferably, the total amount of constituent (B) is not more than 10 wt. % (wt. % means "percent by weight"), more preferably not more than 7 wt. %, most preferably not more than 5 wt. %, particularly not more than 3 wt. %, for example not more than 2.2 wt. %, based in each case on the total weight of the respective CMP composition of the present invention. Preferably, the total amount of constituent (B) is at least 0.002 wt. %, more preferably at least 0.01 wt. %, most preferably at least 0.08 wt. %, particularly at least 0.5 wt. %, for example at least 1 wt. %, based in each case on the total weight of the respective CMP composition of the present invention.

The particle size distribution the particles of constituent (B) can vary within a wide range. The particle size distribution of the particles constituent (B) can be monomodal or multimodal. In case of a multimodal particle size distribution, bimodal is often preferred. In order to have an easily reproducible property profile and easily reproducible conditions during the CMP process of the invention, a monomodal particle size distribution is preferred for constituent (B).

The mean particle size of the particles of constituent (B) can vary within a wide range. The mean particle size is the $d_{50}$ value of the particle size distribution of the particles of constituent (B) in an aqueous medium and can be determined using dynamic light scattering techniques. Then, the $d_{50}$ value is calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles of constituent (B) is in the range of from 5 to 500 nm, more preferably in the range of from 10 to 400 nm, most preferably in the range of from 20 to 300 nm, in particular in the range of from 30 to 160 nm, for example in the range of from 35 to 135 nm, in each case as measured with dynamic light scattering techniques using instruments such as High Performance Particle Sizer (HPPS) from Malvern Instruments, Ltd. or Horiba LB550.

The particles of constituent (B) can be of various shapes. Thereby, the particles of constituent (B) may be of one or essentially only one type of shape. However, it is also possible that the particles of constituent (B) have different shapes. For instance, two types of differently shaped particles may be present. For example, particles used in or as constituent (B) can have the shape of cubes, cubes with chamfered edges, octahedrons, icosahedrons, cocoons, nodules or spheres with or without protrusions or indentations. Preferably, they are spherical with no or only very few protrusions or indentations.

According to another embodiment, the particles (B) are preferably cocoon-shaped. The cocoons may be with or without protrusions or indentations. Cocoon-shaped particles are particles with a minor axis of from 10 to 200 nm, a ratio of major/minor axis of 1.4 to 2.2, more preferably of 1.6 to 2.0. Preferably they have an averaged shape factor of from 0.7 to 0.97, more preferably of from 0.77 to 0.92, preferably an averaged sphericity of from 0.4 to 0.9, more preferably of from 0.5 to 0.7 and preferably an averaged equivalent circle diameter of from 41 to 66 nm, more preferably of from 48 to 60 nm, which can be determined by transmission electron microscopy and scanning electron microscopy.

The determination of the shape factor, the sphericity and the equivalent circle diameter of cocoon-shaped particles is explained hereinbelow with reference to FIGS. 1 to 4. The figures show:

FIG. 1: Schematic illustration of the variation of the shape factor with the shape of a particle FIG. 2: Schematic illustration of the variation of the sphericity with the elongation of a particle FIG. 3: Schematic illustration of the Equivalent Circle Diameter (ECD)

Figure 4:
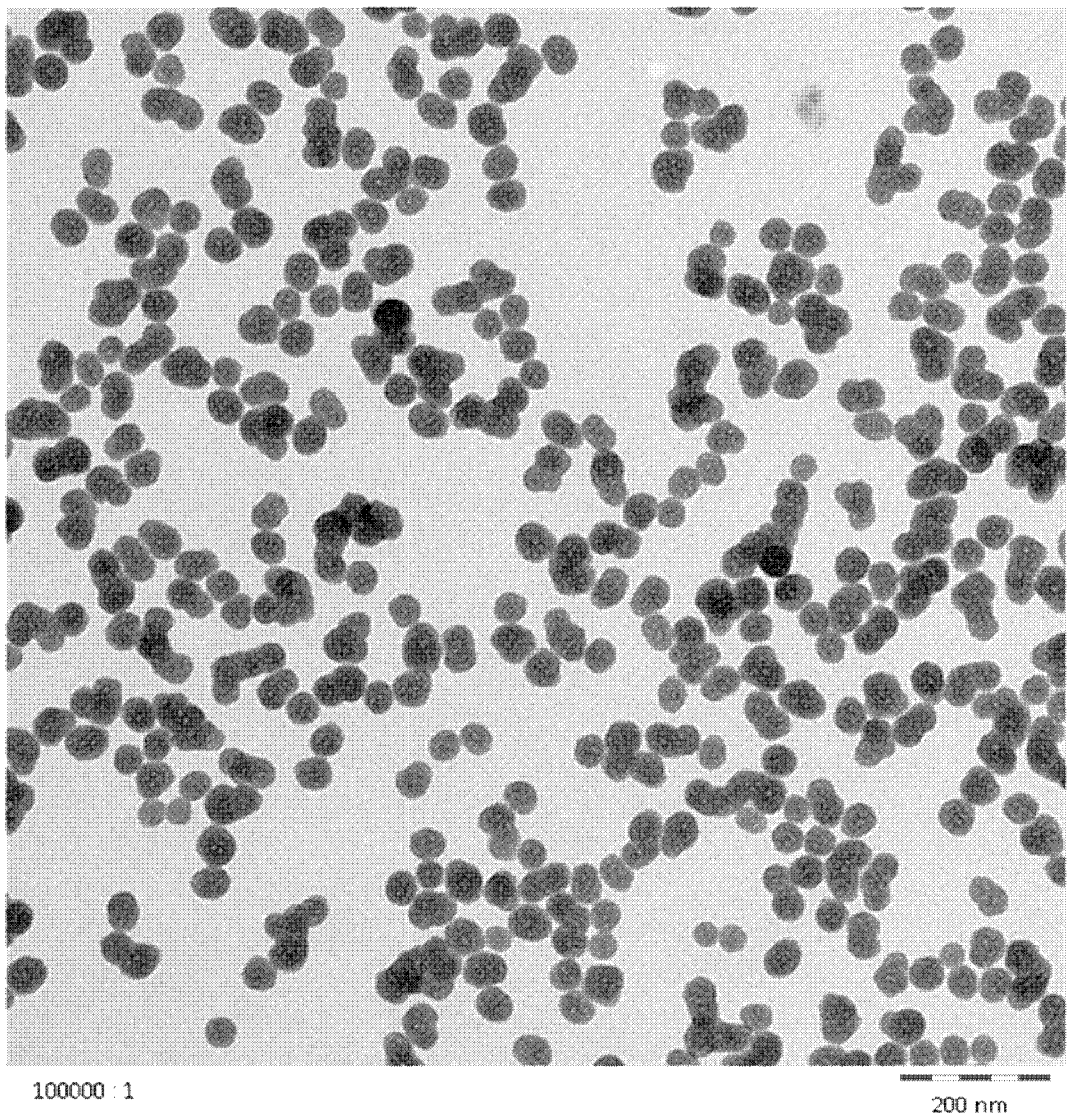

FIG. 4: Energy Filtered-Transmission Electron Microscopy (EF-TEM) (120 kilo volts) image of a dried cocoon-shaped silica particle dispersion with 20 wt. % solid content on a carbon foil The shape factor gives information on the shape and the indentations of an individual particle (see FIG. 1) and can be calculated according to the following formula:

$$\text{shape factor}=4\pi(\text{area/perimeter}^2)$$

The shape factor of a spheric particle without indentations is 1. The value of shape factor decreases when the number of indentations increases.

The sphericity (see FIG. 2) gives information on the elongation of an individual particle using the moment about the mean and can be calculated according to the following formula wherein M are the centres of gravity of the respective particle:

$$\text{sphericity}=(M_{xx}-M_{yy})-[4M_{xy}^2+(M_{yy}-M_{xx})^2]^{0.5}/(M_{xx}-M_{yy})+[4M_{xy}^2+(M_{yy}-M_{xx})^2]^{0.5}$$

$$\text{elongation}=(1/\text{sphericity})^{0.5}$$

wherein $Mxx = \Sigma(x - x_{mean})^2/N$ $Myy = \Sigma(y - y_{mean})^2/N$ $Mxy = \Sigma[(x - x_{mean})*(y - y_{mean})]/N$ N number of pixels forming the image of the respective particle x, y coordinates of the pixels $x_{mean}$ mean value of the x coordinates of the N pixels forming the image of said particle $y_{mean}$ mean value of the y coordinates of the N pixels forming the image of said particle The sphericity of a spheric particle is 1. The value of the sphericity decreases when particles are elongated.

Figure 3:
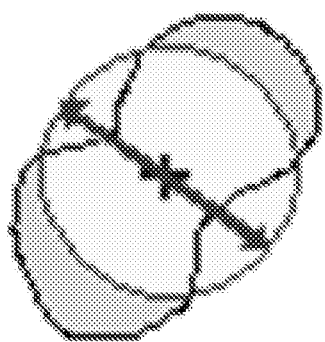

The equivalent circle diameter (also abbreviated as ECD in the following) of an individual non-circular particle gives information on the diameter of a circle which has the same area as the respective non-circular particle (see FIG. 3).

The averaged shape factor, averaged sphericity and averaged ECD are the arithmetic averages of the respective property related to the analyzed number of particles.

The procedure for particle shape characterization is as follows. An aqueous cocoon-shaped silica particle dispersion with 20 wt. % solid content is dispersed on a carbon foil and is dried. The dried dispersion is analyzed by using Energy Filtered-Transmission Electron Microscopy (EF-TEM) (120 kilo volts) and Scanning Electron Microscopy secondary electron image (SEM-SE) (5 kilo volts). The EF-TEM image (see FIG. 4) having a resolution of 2 k, 16 Bit, 0.6851 nm/pixel is used for the analysis. The images are binary coded using the threshold after noise suppression. Afterwards the particles are manually separated. Overlying and edge particles are discriminated and not used for the analysis. ECD, shape factor and sphericity as defined before are calculated and statistically classified.

For example, cocoon-shaped particles are FUSO PL-3 manufactured by Fuso Chemical Corporation having an average primary particle size (d1) of 35 nm and an average secondary particle size (d2) of 70 nm.

The chemical nature of the particles of constituent (B) is not particularly limited. Particles used in or as constituent (B) may be of the same chemical nature or a mixture or composite of particles of different chemical nature. As a rule, particles of the same chemical nature are preferred. Generally, particles of constituent (B) can be inorganic particles such as particles of metal, a metal oxide or carbide, including a metalloid, a metalloid oxide or carbide, or organic particles such as polymer particles, a mixture or composite of inorganic and organic particles.

Particles for use as or in constituent (B) are preferably inorganic particles, or a mixture or composite thereof, more preferably particles selected from the group consisting of oxides and carbides of metals or metalloids, or a mixture or composite thereof, most preferably particles selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, zirconia, and mixtures and composites thereof, particularly preferably particles selected from the group consisting of alumina, ceria, silica, titania, zirconia, and mixtures and composites thereof, in particular silica particles, for instance cocoon-shaped silica particles, for example colloidal silica particles.

If constituent (B) includes organic particles, or a mixture or composite of inorganic and organic particles, polymer particles are preferred as organic particles.

Constituent (C): Complexing Agent(s)

A chemical-mechanical polishing (CMP) composition according to the present invention optionally furthermore comprises (C) one or more complexing agents selected from the group consisting of inorganic acids and their salts and organic acids and their salts. A complexing agent selected from the group of inorganic acids, organic acids and salts thereof is a compound that forms a soluble complex with certain metal ions, thereby inactivating said metal ions so that they cannot normally react with other elements or ions to produce precipitates or scale.

If present, constituent (C), i.e. the total amount of complexing agent(s) of constituent (C), can be contained in any of a broad range of proportions in the CMP composition of the present invention. The total amount of constituent (C) is preferably not more than 10 wt.-%, more preferably not more than 5 wt.-%, most preferably not more than 3 wt.-%, particularly not more than 2 wt.-%, for example not more than 1.5 wt.-%, in each case based on the total weight of the respective CMP composition of the present invention. The total amount of constituent (C) is preferably at least 0.001 wt.-%, more preferably at least 0.01 wt.-%, most preferably at least 0.07 wt.-%, particularly at least 0.2 wt.-%, for example at least 0.7 wt.-%, in each case based on the total weight of the respective CMP composition of the present invention.

Preferably a complexing agent used in or as constituent (C), i.e. the one or at least one of the more than one complexing agents of constituent (C) is selected from the group of inorganic acids and salts thereof and organic acids and salts thereof.

If the one or at least one of the more than one complexing agents of constituent (C) is selected from the group of inorganic acids and salts thereof, said inorganic acid or salt thereof is preferably selected from the group consisting of nitric acid, carbonic acid, hydrogen carbonates, carbonates, hydrochloric acid, phosphoric acid, sulfuric acid, hydrofluoric acid and phosphorous acid.

If the one or at least one of the more than one complexing agents of constituent (C) is selected from the group of organic acids and salts thereof, said organic acid is selected from the group consisting of carboxylic acids, amino acids and sulfonic acids. Preferred carboxylic acids are formic acid, acetic acid, propionic acid, butyric acid, valeric acid, hexanoic acid, malonic acid, succinic acid, glutanic acid, adipic acid, glycolic acid, lactic acid, citric acid, malic acid, tartaric acid, oxalic acid, creatine, dimethylglycine, citric acid, maleic acid, malic acid, pimelic acid, suberic acid, tricarballylic acid, terephthalic acid, 3-hydroxybenzoic acid, 4-hydroxybenzoic acid, benzoic acid, 1,2,4,5-benzenetetracarboxylic acid, phthalic acid, oxalic acid, sebacic acid, itaconic acid. Preferred amino acids are alanine, arginine, asparagine, aspartic acid, cysteine, glutamin, glutamic acid, glycine, histidinw, isoleucine, leucine, lysine, methionine, phenylalanine, proline, serine, threonine, tryptophane, tyrosine and valine.

Preferably, a complexing agent used in or as constituent (C), i.e. the one or at least one of the more than one complexing agents of constituent (C) is a compound comprising at least two carboxylic acid (—COOH) or carboxylate (—COO⁻) groups.

Particularly preferably, the one or at least one of the one or more complexing agents of constituent (C) is selected from the group consisting of malonic acid, citric acid, adipic acid, propane-1,2,3-tricarboxylic acid, butane-1,2,3,4-tetracarboxylic acid, pentane-1,2,3,4,5-pentacarboxylic acid and salts thereof aromatic compounds comprising one or more acid groups.

Constituent (D): Non-Ionic Surfactant(s)

The chemical-mechanical polishing (CMP) composition of the present invention optionally further comprises one or more non-ionic surfactants as constituent (D). Generally, a surfactant used in or as constituent (D) is a surface-active compound which decreases the surface tension of a liquid, the interfacial tension between two liquids, or that between a liquid and a solid. In general, any non-ionic surfactant (D) can be used.

As noted above, substances which because of their structure at the same time fall under the definition of various constituents of a CMP composition according to the invention for quantitative considerations must be assigned in each case to all these constituents.

A non-ionic surfactant used in or as constituent (D), i.e. the one or at least one of the non-ionic surfactants of constituent (D), is preferably water-soluble and/or water-dispersible, more preferably water-soluble. "Water-soluble" means that the relevant component or ingredient of the composition of the invention can be dissolved in the aqueous phase on the molecular level. "Water-dispersible" means that the relevant component or ingredient of the composition of the invention can be dispersed in the aqueous phase and forms a stable emulsion or suspension.

The one or at least one of the more than one non-ionic surfactants of constituent (D) is preferably selected from the group consisting of amphiphilic non-ionic surfactants, i.e. surfactants which comprise one or more hydrophobic groups (d1) and one or more hdroyphilic groups (d2). This means that such nonionic surfactant can comprise more than one hydrophobic group (d1), e.g., 2, 3 or more groups (d1), which are separated from each other by at least one hydrophilic group (d2) as described hereinbelow. This also means that such nonionic surfactant can comprise more than one hydrophilic group (d2), e.g., 2, 3 or more groups (d2) which are separated from each other by at least one hydrophobic group (d1) as described hereinbelow.

Therefore, such nonionic surfactant can have different block-like general structures. Examples of such general block-like structures are:

d1-d2,
d1-d2-d1,
d2-d1-d2,
d2-d1-d2-d1,
d1-d2-d1-d2-d1 and
d2-d1-d2-d1-d2.

More preferably such non-ionic surfactant is an amphiphilic non-ionic surfactant comprising a polyoxyalkylene group as the hydrophilic group (d2). The hydrophobic group (d1) is preferably an alkyl group, more preferably an alkyl group having 4 to 40, most preferably 5 to 20, particularly preferably 7 to 18, in particular 10 to 16, for example 11 to 14 carbon atoms.

The hydrophilic group (d2) is preferably a polyoxyalkylene group. Said polyoxyalkylene groups can be oligomeric or polymeric. More preferably, the hydrophilic group (d2) is a hydrophilic group selected from the group consisting of polyoxyalkylene groups comprising (d21) oxyalkylene monomer units, and (d22) oxyalkylene monomer units other than oxyethylene monomer units, said monomer units (d21) being not identical to monomer units (d22), and said polyoxyalkylene group of (d2) containing the monomer units (d21) and (d22) in random, alternating, gradient and/or block-like distribution.

Most preferably, the hydrophilic group (d2) is a hydrophilic group selected from the group consisting of polyoxyalkylene groups comprising (d21) oxyethylene monomer units, and (d22) oxyalkylene monomer units other than oxyethylene monomer units, said polyoxyalkylene group of (d2) containing the monomer units (d21) and (d22) in random alternating, gradient and/or block-like distribution.

Preferably, the oxyalkylene monomer units (d22) other than oxyethylene monomer units are substituted oxyalkylene monomer units wherein the substituents are selected from the group consisting of alkyl, cycloalkyl, aryl, alkylcycloalkyl, alkyl-aryl, cycloalkyl-aryl and alkyl-cycloalkyl-aryl groups. The oxyalkylene monomer units (d22) other tan oxyethylene monomer units are more preferably derived from substituted oxiranes (X) wherein the substituents are selected from the group consisting of alkyl, cycloalkyl, aryl, alkyl-cycloalkyl, alkyl-aryl, cycloalkyl-aryl and alkyl-cycloalkyl-aryl groups, most preferably derived from alkyl-substituted oxiranes (X), particularly preferably derived from substituted oxiranes (X) wherein the substituents are selected from the group consisting of alkyl groups having 1 to 10 carbon atoms, for example derived from methyl oxirane (propylene oxide) and/or ethyl oxirane (butylene oxide).

The substituents of the substituted oxiranes (X) themselves can also carry inert substituents, i.e. substituents which do not adversely affect the copolymerization of the oxiranes (X) and the surface activity of the non-ionic surfactants (D). Examples of such inert substituents are fluorine and chlorine atoms, nitro groups and nitrile groups. If such inert substituents are present, they are preferably present in such amounts that they do not adversely affect the hydrophilic-hydrophobic balance of the non-ionic surfactant (D). Preferably, the substituents of the substituted oxiranes (X) do not carry such inert substituents.

The substituents of the substituted oxiranes (X) are preferably selected from the group consisting of alkyl groups having 1 to 10 carbon atoms, cycloalkyl groups having 5 to 10 carbon atoms, in spirocyclic, exocyclic and/or annealed configuration, aryl groups having 6 to 10 carbon atoms, alkyl-cycloalkyl groups having 6 to 20 carbon atoms, alkylaryl groups having 7 to 20 carbon atoms, cycloalkylaryl groups having 11 to 20 carbon atoms, and alkyl-cycloalkyl-aryl groups having 12 to 30 carbon atoms. Most preferably, the substituents of the substituted oxiranes (X) are selected from the group consisting of alkyl groups having 1 to 10 carbon atoms. Particularly, the substituents of the substituted oxiranes (X) are selected from the group consisting of alkyl groups having 1 to 6 carbon atoms.

Examples for the most preferred substituted oxiranes (X) are methyl oxirane (propyleneoxide) and/or ethyl oxirane (butylene oxide), particularly methyl oxirane.

Most preferably, the hydrophilic group (d2) consists of the monomer units (d21) and (d22).

In another embodiment, the hydrophilic group (d2) is preferably a polyoxyethylene, polyoxypropylene or polyoxybutylene group, more preferably a polyoxyethylene group.

In the embodiments where the hydrophilic group (d2) comprises or consists of the monomer units (d21) and (d22), the polyoxyalkylene group—acting as hydrophilic group (d2)—contains the monomer units (d21) and (d22) in random, alternating, gradient and/or block-like distribution. This means that one hydrophilic group (d2) can have only one type of distribution, i.e.

random: . . . -d21-d22-d21-d22-d22-d22-d21-d22- . . . ;
alternating: . . . -d21-d22-d21-d22-d21- . . . ;
gradient: . . . -d21-d21-d21-d22-d21-d21-d22-d22-d21-d22-d22-d22- . . . ; or
block-like: . . . -d21-d21-d21-d21-d22-d22-d22-d22- . . .

Alternatively, the hydrophilic group (d2) can also contain at least two types of distributions, e.g. an oligomeric or polymeric segment having a random distribution and an oligomeric or polymeric segment having alternating distribution. Most preferably, the hydrophilic group (d2) preferably has only one type of distribution, and most preferably, said distribution is random or blocklike.

In the embodiments where the hydrophilic group (d2) comprises or consists of the monomer units (d21) and (d22), the molar ratio of (d21) to (d22) can vary broadly and, therefore, can be adjusted most advantageously to the particular requirements of the composition, the process and the use of the invention. Preferably the molar ratio (d21):(d22) is from 100:1 to 1:1, more preferably, from 60:1 to 1.5:1 and, most preferably, from 50:1 to 1.5:1, and particularly preferably, from 25:1 to 1.5:1, and particularly, from 15:1 to 2:1, and for example, from 9:1 to 2:1.

Also the degree of polymerization of the oligomeric and polymeric polyoxyalkylene groups—acting as hydrophilic groups (d2)—can vary broadly and, therefore, can be adjusted most advantageously to the particular requirements of the composition, the process and the use of the invention. Preferably, the degree of polymerization is in the range of from 5 to 100, preferably 5 to 90, and most preferably, 5 to 80.

Preferably, a non-ionic surfactant for use in or as constituent (D) is an amphiphilic non-ionic polyoxyethylene-polyoxypropylene alkyl ether surfactant which is a mixture of molecules containing, on the average, an alkyl group having 10 to 16 carbon atoms and
5 to 20 oxyethylene monomer units (d21) and
2 to 8 oxypropylene monomer units (d22)
in random distribution.

For example, the non-ionic surfactant for use in or as constituent (D) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units and 3 to 5 oxypropylene monomer units in random distribution.

If present, constituent (D), i.e. the total amount of non-ionic surfactant(s) of constituent (D) can be contained in any of a broad range of proportions in the CMP composition of the present invention. Preferably, the total amount of constituent (D) is not more than 10 wt. %, more preferably not more than 3 wt. %, most preferably not more than 1 wt. %, particularly preferably not more than 0.5 wt. %, particularly not more than 0.1 wt. %, for example not more than 0.05 wt. %, in each case based on the total weight of the respective CMP composition of the present invention. Preferably, the total amount of constituent (D) is at least 0.00001 wt. %, more preferably at least 0.0001 wt. %, most preferably at least 0.0008 wt. %, particularly preferably at least 0.002 wt. %, particularly at least 0.005 wt. %, for example at least 0.008 wt. %, in each case based on the total weight of the respective CMP composition of the present invention.

In general, the solubility of constituent (D) in an aqueous medium can vary within a wide range. The solubility of constituent (D) in water at pH 7 at 20° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution.

Constituent (E): Alcohol(s)

The chemical-mechanical polishing (CMP) composition of the present invention optionally further comprises one or more alcohols as constituent (E).

As noted above, substances which because of their structure at the same time fall under the definition of various constituents of a CMP composition according to the invention for quantitative considerations must be assigned in each case to all these constituents. For example, where a composition according to the invention contains in or as constituent (E) one or more alcohols which at the same time fall under the definition of non-ionic surfactants used in or as constituent (D) as defined above, for the purpose of quantitative considerations these surfactants must be assigned to both constituent (E) and constituent (D).

An alcohol used in or as constituent (E), i.e. the one or at least one of the more than one alcohols of constituent (E), is preferably an alcohol having at least two hydroxyl groups which are not dissociable in the aqueous medium. More preferably (E) is an alcohol having two hydroxyl groups which are not dissociable in the aqueous medium. "Not dissociable" means that the $pK_a$ value (logarithmic measure of the acid dissociation constant) for the reaction

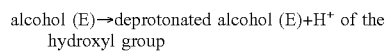
alcohol (E)→deprotonated alcohol (E)+H$^+$ of the hydroxyl group in the neutral aqueous phase is more than 9.9, more preferably more than 11, most preferably more than 12, particularly preferably more than 13, for example more than 14 as measured in de-ionized water at 25° C. and atmospheric pressure. For example, propane-1,2-diol (alpha-propylene glycol) has a $pK_a$ value of 14.9 as measured in de-ionized water at 25° C. and atmospheric pressure.

More preferably, an alcohol used in or as constituent (E) is a diol, triol, tetraol, pentaol, hexaol, heptaol, octaol, nonaol, decaol, or a polyol. Most preferably, such alcohol is a diol, triol, pentaol, or hexaol. Particularly preferably, such alcohol is a diol. Particularly most preferably, the one or at least one of the more than one alcohols of constituent (E) is selected from the group consisting of ethanediol (ethylene glycol), propanediol (propylene glycol) and butanediol (butylene glycol). In particular, the one or at least one of the more than one alcohols of constituent (E) is propanediol (propylene glycol).

An alcohol used in or as constituent (E) is preferably an alcohol having 2 to 50 carbon atoms, more preferably an alcohol having 2 to 20 carbon atoms, most preferably an alcohol having 2 to 11 carbon atoms, particularly preferably an alcohol having 2 to 7 carbon atoms, in particular an alcohol having 2 to 4 carbon atoms, for example an alcohol having 3 carbon atoms.

If present, constituent (E), i.e. the total amount of alcohol(s) of constituent (E) can be contained in any of a broad range of proportions in the CMP composition of the present invention. Preferably, the total amount of constituent (E) is not more than 10 wt. %, more preferably not more than 5 wt. %, most preferably not more than 3 wt. %, particularly preferably not more than 2 wt. %, particularly not more than 1.2 wt. %, for example not more than 0.8 wt. %, in each case based on the total weight of respective CMP composition of the present invention. Preferably, the total amount of constituent (E) is at least 0.001 wt. %, more preferably at least 0.01 wt. %, most preferably at least 0.05 wt. %, particularly preferably at least 0.1 wt. %, particularly at least 0.3 wt. %, for example at least 0.5 wt. %, in each case based on the total weight of the respective CMP composition of the present invention.

In general, the solubility of constituent (E) can vary within a wide range. The solubility of constituent (E) in water at pH 7 at 25° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution.

Constituent (F): Oxidizing Agent(s)

The chemical-mechanical polishing (CMP) composition of the present invention further optionally comprises as constituent (F) one or more oxidizing agents, preferably one or two types of oxidizing agent, more preferably one type of oxidizing agent. In general, an oxidizing agent used in or as constituent (F) is a compound which is capable of oxidizing the to-be-polished substrate or one of its layers.

As noted above, substances which because of their structure at the same time fall under the definition of various constituents of a CMP composition according to the invention for quantitative considerations must be assigned in each case to all these constituents. For example, where a composition according to the invention contains in or as constituent (F) one or more oxidizing agents which at the same time fall under the definition of any other constituent defined above, for the purpose of quantitative considerations these oxidizing agents must be assigned to constituent (F) as well as said other constituent(s).

Preferably, one or at least one of the more than one oxidizing agents used in or as constituent (F) is a per-type oxidizer. More preferably, the one or at least one of the more than one oxidizing agent of constituent (F) is selected from the group consisting of peroxides, persulfates, perchlorates, perbromates, periodates and permanganates and derivates thereof. Most preferably, such oxidizing agent is a peroxide or persulfate. Particularly, such oxidizing agent is a peroxide. For example, such oxidizing agent is hydrogen peroxide.

If present, constituent (F), i.e. the total amount of oxidizing agent(s) of constituent (F), can be contained in any of a broad range of proportions in the CMP composition of the present invention. Preferably, the total amount of constituent (F) is not more than 20 wt. %, more preferably not more than 10 wt. %, most preferably not more than 5 wt. %, particularly not more than 2.5 wt. %, for example not more than 1.5 wt. %, in each case based on the total weight of the composition. Preferably, the total amount of constituent (F) is at least 0.01 wt. %, more preferably at least 0.08 wt. %, most preferably at least 0.4 wt. %, particularly at least 0.75 wt. %, for example at least 1 wt. %, in each case based on the total weight of the respective CMP composition of the present invention. If hydrogen peroxide is used as the sole oxidizing agent of constituent (F), the total amount of constituent (F) is preferably 0.5 wt. % to 4 wt. %, more preferably 1 wt. % to 2 wt. %, for instance 1.2 to 1.3 wt. %, in each case based on the total weight of the respective CMP composition of the present invention.

The chemical-mechanical polishing (CMP) composition in addition to constituents (A), (B), (C), (D), (E) and (F) can comprise one or more additional constituents as defined hereinbelow.

Constituent (G): Further Corrosion Inhibitor(s)

In addition to the one or more compounds of formula (1) present as constituent (A), the chemical-mechanical polishing (CMP) composition of the present invention further optionally contains as constituent (G) one or more further corrosion inhibitors.

As noted above, substances which because of their structure at the same time fall under the definition of various constituents of a CMP composition according to the invention for quantitative considerations must be assigned in each case to all these constituents. For example, where a composition according to the invention contains in or as constituent (G) one or more further corrosion inhibitor(s) which at the same time fall under the definition of alcohols used in or as constituent (E) as defined above, for the purpose of quantitative considerations these surfactants must be assigned to both constituent (G) and constituent (E).

Preferably, one or at least one of the more than one further corrosion inhibitors of constituent (G) are thiols, film forming polymers, polyols, diazoles, triazoles, tetrazoles and their derivatives, most preferably imidazole, 1,2,4-triazole, benzotriazole, tolytriazole, and derivatives thereof, wherein the compounds of formula (1) as defined above are excluded and can therefore not be considered to be further corrosion inhibitors of constituent (G).

The total amount of constituent (A), i.e. compound(s) of formula (1) as defined above, and constituent (G), i.e. further corrosion inhibitor(s) as defined above, is preferably not more than 10 wt. %, more preferably not more than 2 wt. %, most preferably not more than 0.5 wt. %, particularly not more than 0.15 wt. %, for example not more than 0.08 wt. %, in each case based on the total weight of the respective CMP composition of the present invention. The total amount of constituent (A) and constituent (G) is preferably at least 0.0001 wt. %, more preferably at least 0.001 wt. %, most preferably at least 0.005 wt. %, particularly at least 0.02 wt. %, for example at least 0.04 wt. %, in each case based on the total weight of the respective CMP composition of the present invention.

Presence of Divalent Cations

In the chemical-mechanical polishing (CMP) composition of the present invention, the total amount of divalent cations selected from the group consisting of magnesium and calcium is less than 1 ppm based on the total weight of the respective CMP composition.

The presence of divalent cations selected from the group consisting of magnesium and calcium in an amount of 1 ppm or more (based on the total weight of the respective CMP composition) is detrimental to the stability of a chemical-mechanical polishing (CMP) composition, because with certain anions, e.g., carbonates, calcium and magnesium cations form poorly soluble salts which precipitate. Moreover, divalent cations, due to the presence of two valencies, may form salt bridges which crosslink entities carrying negative charges, e.g. polymeric anions, thus resulting in formation of larger entities of poor solubility or poor dispersibility. Both reactions result in altering the amount of solid substances in the CMP composition, thus disturbing the polishing process and increasing the risk of damaging the substrate to be polished.

It is preferred that the chemical mechanical polishing (CMP) composition of the present invention composition contains cations selected from the group consisting of magnesium and calcium in an amount of less than 0.9 ppm, preferably in a total amount of less than 0.5 ppm (in each case based on the total weight of the respective CMP composition), and most preferably does not contain any cations selected from the group consisting of magnesium and calcium. More preferably the chemical mechanical polishing (CMP) composition according to the invention composition contains divalent metal cations in an amount of less than 1 ppm preferably less than 0.9 ppm (in each case based on the total weight of the respective CMP composition), and most preferably does not contain any divalent metal cations. Accordingly, as far as any of the constituents of the chemical mechanical polishing (CMP) composition are salts, it is preferred that those salts do not contain cations selected from the group consisting of magnesium and calcium, and more preferably do not contain any divalent metal cations.

pH Value of the CMP Composition

The properties of the chemical-mechanical polishing (CMP) composition of the present invention, such as stability and polishing performance, may depend on the pH of said composition. In general, the CMP composition can have any pH value. Preferably, the pH value of the composition is not more than 14, more preferably not more than 13, most preferably not more than 12, particularly preferably not more than 11.5, particularly most preferably not more than 11, particularly not more than 10.5, for example not more than 10.2. The pH value of the composition is preferably at least 6, more preferably at least 7, most preferably at least 8, particularly preferably at least 8.5, particularly most preferably at least 9, particularly at least 9.5, for example at least 9.7. The pH value of the composition is preferably in the range of from 6 to 14, more preferably from 7 to 13, most preferably from 8 to 12, particularly preferably from 8.5 to 11.5, particularly most preferably from 9 to 11, particularly from 9.5 to 10.5, for example from 9.7 to 10.2.

In the process of preparing a chemical-mechanical polishing (CMP) composition of the present invention, the pH value of the (CMP) composition of the present invention is optionally adjusted by adding one or more additional pH adjusting agents (H). In general, a pH adjusting agent for use in preparation of a CMP composition of the present invention is a compound which is added to the CMP composition to have its pH value adjusted to the required value.

A chemical-mechanical polishing (CMP) composition having a pH in the above-defined range is obtainable by mixing
(H) one or more pH adjusting agents
with the constituents (A), (B) and optionally one, more or all of constituents (C), (D), (E), (F) and (I) (see below) of the chemical-mechanical polishing composition.

The one or at least one of the more than one pH adjusting agents (H) is preferably selected from the group consisting of nitric acid, sulfuric acid, ammonia, tetramethylammonium hydroxide, sodium hydroxide and potassium hydroxide. In the process of preparing a chemical-mechanical polishing (CMP) composition of the present invention, one or more pH adjusting agents (H) are used in order to adjust the pH value to the desired level. Typically a CMP composition having a pH in the above-defined preferred range is obtainable (and obtained) by a method comprising the step of adjusting the pH by adding (H) one or more pH adjusting agents to a corresponding pre-mixture comprising all or some of constituents (A), (B), (C), (D), (E), (F) and (I) of the CMP composition according to the present invention (for the definition of constituent (I) see below).

Preferably, said one or at least one of the more than one pH adjusting agents (H) is selected from the group consisting of inorganic acids, carboxylic acids, amine bases, alkali hydroxides and ammonium hydroxides, including tetraalkylammonium hydroxides. Particularly, said one or at least one of the more than one pH adjusting agents (H) is selected from the group consisting of nitric acid, sulfuric acid, hydrochloric acid, ammonia, tetramethylammonium hydroxide, sodium hydroxide and potassium hydroxide. Preferably, in the process of preparing a CMP composition of the present invention the pH value is adjusted by one pH adjusting agent (H). For example, the pH adjusting agent (H) is potassium hydroxide.

As noted above, substances which because of their structure at the same time fall under the definition of various constituents of a CMP composition according to the invention for quantitative considerations must be assigned in each case to all these constituents. For example, where a composition according to the invention contains in or as constituent (H) one or more pH adjusting agent(s) which at the same time fall under the definition of complexing agents used in or as constituent (C) as defined above, for the purpose of quantitative considerations these surfactants must be assigned to both constituent (H) and constituent (C).

If one or more pH adjusting agents are used, the total amount of pH adjusting agent(s) (H) added in the process of preparing a chemical-mechanical polishing (CMP) composition of the present invention can be any of a broad range of proportions. If present, the total amount of pH adjusting agents (H) added in the process of preparing a chemical-mechanical polishing (CMP) composition of the present invention is preferably not more than 10 wt. %, more preferably not more than 2 wt. %, most preferably not more than 0.5 wt. %, particularly not more than 0.1 wt. %, for example not more than 0.05 wt. %, in each case based on the total weight of the respective CMP composition of the present invention. If present, the total amount of pH adjusting agents (H) added in the process of preparing a chemical-mechanical polishing (CMP) composition of the present invention is preferably at least 0.0005 wt. %, more preferably at least 0.005 wt. %, most preferably at least 0.025 wt. %, particularly at least 0.1 wt. %, for example at least 0.4 wt. %, in each case based on the total weight of the respective CMP composition of the present invention.

Constituent (I): Buffer(s)

According to the invention, the CMP composition of the present invention further optionally comprises one or more buffers (I). In general, a buffer for use in or as constituent (I) is a compound or mixture which is added to the CMP composition to maintain the pH value at the required level.

Preferably, the one or at least one of the more than one buffers of constituent (I) is a carbonate or hydrogen carbonate salt. In general, a carbonate salt is any salt comprising at least one $CO_3^{2-}$ anion, and a hydrogen carbonate salt is any salt comprising at least one $HCO_3^-$ anion. Preferably, the carbonate or hydrogen carbonate salt does not comprise any anions other than $CO_3^{2-}$ or $HCO_3^-$ anions. Preferably, the buffer is a carbonate salt. Most preferably, the one or at least one of the more than one buffers of constituent (I) is a carbonate salt which does not comprise any anions other than the $CO_3^{2-}$ anion.

Preferably, the carbonate or hydrogen carbonate salt for use as or in constituent (I) comprises at least one cation selected from the group consisting of $NH_4^+$ cation, organic ammonium cations (as defined below), N-heterocyclic cations and alkali metal cations. More preferably, the carbonate or hydrogen carbonate salt comprises at least one of $NH_4^+$ and alkali metal cations. Most preferably, a carbonate or hydrogen carbonate salt for use as or in constituent (I) comprises at least one alkali metal cation. Particularly preferably, the carbonate or hydrogen carbonate salt for use as or in constituent (I) comprises at least one sodium or potassium cation. Particularly most preferably, a carbonate or hydrogen carbonate salt for use as or in constituent (I) comprises at least one potassium cation. Particularly, the one or at least one of the more than one buffers of constituent (I) is preferably selected from the group consisting of potassium carbonate or potassium hydrogen carbonate.

For example, the carbonate or hydrogen carbonate salt for use as or in constituent (I) is potassium carbonate.

An organic ammonium cation is any cation of the formula $[NR^{11}R^{12}R^{13}R^{14}]^+$, wherein $R^{11}$, $R^{12}$, $R^{13}$ is—independently from each other—H, alkyl, aryl, alkylaryl, or arylalkyl, and $R^{14}$ is alkyl, aryl, alkylaryl, or arylalkyl.

If present, constituent (I), i.e. the total amount of buffer(s) of constituent (I) can be contained in any of a broad range of proportions in the CMP composition of the present invention. Preferably, the total amount of constituent (I) is not more than 10 wt. %, more preferably not more than 5 wt. %, most preferably not more than 3 wt. %, particularly preferably not more than 2 wt. %, particularly not more than 1 wt. %, for example not more than 0.7 wt. %, in each case based on the total weight of the respective CMP composition of the present invention. Preferably, the total amount of constituent (I) is at least 0.001 wt. %, more preferably at least 0.01 wt. %, most preferably at least 0.05 wt. %, particularly preferably at least 0.1 wt. %, particularly at least 0.2 wt. %, for example at least 0.4 wt. %, in each case based on the total weight of the respective CMP composition of the present invention.

As noted above, substances which because of their structure at the same time fall under the definition of various constituents of a CMP composition according to the invention for quantitative considerations must be assigned in each case to all these constituents. For example, where a composition according to the invention contains in or as constituent (I) one or more buffer(s) which at the same time fall under the definition of complexing agents used in or as constituent (C) as defined above, for the purpose of quantitative considerations these surfactants must be assigned to both constituent (I) and constituent (C).

Constituent (J): Biocides

The CMP composition of the present invention further optionally contains one or more biocides (J), for example one biocide. In general, one or at least one of the more than one biocides used in or as constituent (J) is a compound which deters, renders harmless, or exerts a controlling effect on any harmful organism by chemical or biological means.

Preferably, one or at least one of the more than one biocide used in or as constituent (J) is selected from the group consisting of quaternary ammonium compounds (with the exception of quaternary ammonium carbonates and quaternary ammonium hydrocarbonates) isothiazolinone-based compounds, N-substituted diazenium dioxides and N'-hydroxy-diazenium oxide salts. More preferably, (J) is an N-substituted diazenium dioxide, or an N'-hydroxy-diazenium oxide salt.

If present, constituent (J), i.e. the total amount of biocide(s) of constituent (J) can be contained in in any of a broad range of proportions in the CMP composition of the present invention. If present, the total amount of constituent (J) is preferably not more than 0.5 wt. %, more preferably not more than 0.1 wt. %, most preferably not more than 0.05 wt. %, particularly not more than 0.02 wt. %, for example not more than 0.008 wt. %, in each case based on the total weight of the respective CMP composition of the present invention. If present, the total amount of constituent (J) is preferably at least 0.0001 wt. %, more preferably at least 0.0005 wt. %, most preferably at least 0.001 wt. %, particularly at least 0.003 wt. %, for example at least 0.006 wt. %, in each case based on the total weight of the respective CMP composition of the present invention.

According to the present invention, preferred is a chemical mechanical polishing (CMP) composition comprising (A) a total amount of one or more compounds of formula (1) in a range of from 0.0001 wt-% to 1 wt.-% based on the total weight of the respective CMP composition.

According to the present invention, also preferred is a chemical mechanical polishing (CMP) composition comprising (B) a total amount of inorganic particles, organic particles, or a composite or mixture thereof in a range of from 0.002 to 10 wt.-% based on the total weight of the respective CMP composition, According to the present invention, also preferred is a chemical mechanical polishing (CMP) composition comprising (C) a total amount of one or more complexing agents selected from the group of organic acids and salts thereof in a range of from 0.001 to 10 wt.-% based on the total weight of the respective CM P composition, According to the present invention, also preferred is a chemical mechanical polishing (CMP) composition comprising (D) a total amount of one or more non-ionic surfactants in a range of from 0.00001 to 10 wt.-% based on the total weight of the respective CM P composition, According to the present invention, also preferred is a chemical mechanical polishing (CMP) composition comprising (E) a total amount of one or more alcohols in a range of from 0.001 to 10 wt.-% based on the total weight of the respective CMP composition, According to the present invention, also preferred is a chemical mechanical polishing (CMP) composition comprising (F) a total amount of one or more oxidizing agents in a range of from 0.01 to 20 wt.-% based on the total weight of the respective CMP composition, According to the present invention, also preferred is a chemical mechanical polishing (CMP) composition comprising (I) a total amount of one or more buffers in a range of from 0.001 to 10 wt.-% based on the total weight of the respective CMP composition.

Also preferred are any combinations of the above-defined preferred concentration ranges of constituents (A), (B), (C), (D), (E), (F) and (I).

Most preferred according to the present invention is a chemical mechanical polishing (CMP) composition comprising (A) a total amount of one or more compounds of formula (1) in a range of from 0.0001% to 1 wt.-% based on the total weight of the respective CMP composition, and (B) a total amount of inorganic particles, organic particles, or a composite or mixture thereof in a range of from 0.002 to 10 wt.-% based on the total weight of the respective CMP composition,
and
(C) a total amount of one or more complexing agents selected from the group of organic acids and salts thereof in a range of from 0.001 to 10 wt.-% based on the total weight of the respective CMP composition,
and
(D) a total amount of one or more non-ionic surfactants in a range of from 0.00001 to 10 wt.-% based on the total weight of the respective CMP composition,
and
(E) a total amount of one or more alcohols in a range of from 0.001 to 10 wt.-% based on the total weight of the respective CMP composition,
and
(F) a total amount of one or more oxidizing agents in a range of from 0.01 to 20 wt.-% based on the total weight of the respective CMP composition,
and
(I) a total amount of one or more buffers in a range of from 0.001 to 10 wt.-% based on the total weight of the respective CMP composition.

Processes for preparing CMP compositions are generally known. These processes may be applied to the preparation of the CMP composition of the present invention. A CMP composition of the present invention is preparable by dispersing or dissolving the above-described constituents (A) and (B) and—if present—the further constituents (C), (D), (E), (F), (G) and (J) in an aqueous medium, preferably water, and optionally by adjusting the pH value by adding one or more pH adjusting agents (H) and/or maintaining the pH by one or more buffers (I). Thus, the CMP composition is preferably preparable by dispersing the particles (B), and dispersing and/or dissolving constituent (A) and—if present—the further constituents (C), (D), (E), (F), (G), (I) and (J) and one or more pH adjusting agents (H) in an aqueous medium, preferably water.

For this purpose, the customary and standard mixing processes and mixing apparatuses such as agitated vessels, high shear impellers, ultrasonic mixers, homogenizer nozzles or counterflow mixers, can be used.

Chemical Mechanical Polishing Process:

The chemical mechanical polishing (CMP) process is generally known and can be carried out with the techniques and the equipment under the conditions customarily used for the CMP process in the fabrication of wafers with integrated circuits. There is no restriction on the equipment with which the polishing process can be carried out.

As is known in the art, typical equipment for the CMP process consists of a rotating platen which is covered with a polishing pad. Orbital polishers may be used, too. The wafer is mounted on a carrier or chuck. The side of the wafer being processed is facing the polishing pad (single side polishing process). A retaining ring secures the wafer in the horizontal position.

Below the carrier, the larger diameter platen is generally horizontally positioned and presents a surface parallel to that of the wafer to be polished. The polishing pad on the platen contacts the wafer surface during the planarization process.

To produce the desired material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

Figure 2:
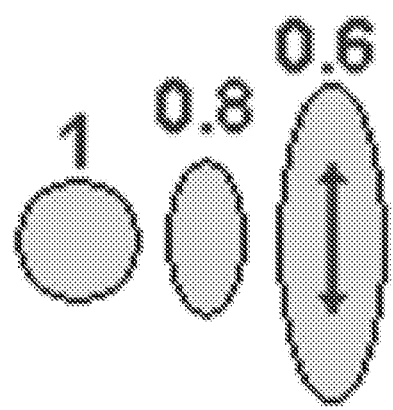

For further details of a CMP process, reference is made to WO 2004/063301 A1, in particular page 16, paragraph [0036] to page 18, paragraph [0040] in conjunction with FIGS. 1 and 2.

By way of a CMP process using the CMP composition of the invention, wafers with integrated circuits comprising a dielectric layer can be obtained which have an excellent functionality.

CMP compositions of the present invention are provided for the CMP process in the form of a ready-to-use slurry. CMP compositions of the present invention have a long shelf-life, show a stable particle size distribution over long time without agglomeration, and maintain a high MRR of barrier layer. Thus, they are easy to handle and to store.

Moreover, as shown by the examples presented hereinbelow, the CMP compositions of the present invention combine two, more or all of the following properties: (a) high MRR of barrier layer, (b) low MRR of copper layer, (c) low MRR of low-k or ultra-low-k materials, (d) high selectivity for barrier layer over copper layer with regard to MRR, (e) high selectivity for barrier layer over low-k and ultra-low-k materials with regard to MRR. Most particularly, as far as copper layers, tantalum or tantalum nitride layers and low-k or ultra-low-k materials are present in the substrate to be polished, the CMP composition of the invention should show the combination of as many as possible of the following properties: (a') high MRR of tantalum or tantalum nitride, (b') low MRR of copper layer, (c') low MRR of low-k or ultra-low-k materials, (d') high selectivity for tantalum or tantalum nitride over copper with regard to MRR, and (e') high selectivity for tantalum nitride over low-k or ultra-low-k materials with regard to MRR.

The present invention further relates to a process for the manufacture of a semiconductor device comprising chemical mechanical polishing of a substrate in the presence of a chemical mechanical polishing (CMP) composition according to the invention as defined above. In said process according to the invention, the substrate to be polished preferably comprises a surface region consisting of tantalum or of a tantalum alloy or tantalum nitride and/or a surface region consisting of copper or of a copper alloy.

The invention is hereinafter further illustrated by means of examples and comparison examples.

EXAMPLES AND COMPARATIVE EXAMPLES

Synthesis of Corrosion Inhibitors (A)

Substituted BTA derivatives were synthesized according to or analogous to literature (El-Hamouly, W. S.; Abd-Allah, Sh. M.; Tawfik, H. A., Egyptian Journal of Chemistry (2004), 47(3), 333-343.)

The general reaction scheme is as follows:

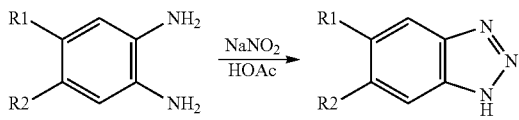

General Experimental Procedure:

In a 250 mL four-necked flask with mechanical stirrer, thermometer, reflux condenser, nitrogen inlet and bubble counter, the respective o-diaminobenzene (0.031 mol) (formula 1a) was added portionwise to glacial acetic acid (50 mL) under an atmosphere of nitrogen. The resulting slurry was cooled to 4° C. in an ice-bath. A solution of sodium nitrite (2.24 g, 0.032 mol) in water (6 mL) was added dropwise over 40 min while maintaining the temperature of the reaction mixture <10° C. The resulting slurry was warmed to room temperature and stirred until analysis for free $HNO_2$ using KI/amylose test paper was negative and no starting material was visible in thin layer chromatography (16 h).

The working-up procedures of the compounds of formula (1) used in examples 8-11 and 13 (see table 1 below) are as follows:

5-bromo-1H-benzotriazole $R^1$=Br $R^2$=H
(Example 8)

The resulting slurry was filtered; the solid residue washed with water (100 mL) and the resulting solid was further purified by recrystallization from ethanol (20 mL). The product was dried for 24 h at 50° C. and 5 mbar and obtained as off-white solid. Yield: 67%.

$^1$H-NMR (500 MHz, $d_6$-DMSO) δ=8.20 (d, J=1.7 Hz, 1H, H-4), 7.91 (d, J=8.8 Hz, 1H, H-7), 7.57 (dd, J=1.7 Hz, J=8.8 Hz, 1H, H-6) ppm.

5-tert-butyl-1H-benzotriazole $R^1$=t-Bu $R^2$=H
(Example 9)

To the resulting solution, water (70 mL) was added whereupon an oily phase separated from the solution. The oil was collected and the aqueous layer extracted with $CH_2Cl_2$ (3×30 mL). The combined organic layers were washed with a solution of sodium bicarbonate (15 wt % in water, 2×100 mL) and brine (10 mL), dried over magnesium sulfate, filtered and evaporated. The product was obtained as an oily liquid that crystallized upon standing. Yield: 92%.

$^1$H-NMR (500 MHz, $CDCl_3$) δ=15.74-10.98 (brs, 1H, NH), 7.91-7.88 (m, 2H, H-4, H-7), 7.54-7.52 (m, 1H, H-6) ppm.

MS (EI): m/z calcd. for $C_{10}H_{13}N_3$ 175. Found 175.

5-(benzoyl)-1H-benzotriazole $R^1$=Bz $R^2$=H
(Example 10)

The resulting slurry was filtered; the solid residue washed with water (100 mL) and the resulting solid was further purified by recrystallization from ethanol (20 mL). The product was dried for 24 h at 50° C. and 5 mbar and obtained as off-white solid. Yield: 91%. Purity (HPLC): 99.74%.

$^1$H-NMR (500 MHz, $d_6$-DMSO) δ=16.77-15.14 (brs, 1H, NH), 8.72 (d, J=1.3 Hz, 1H, H-4), 8.04 (d, J=8.8 Hz, 1H, H-7), 7.88 (dd, J=1.3 Hz, J=8.8 Hz, 1H, H-6), 7.81-7.79 (m, 2H, H-2', H-6'), 7.73-7.70 (m, 1H, H-4'), 7.61-7.58 (m, 1H, H-3', H-5') ppm.

5,6-dibromo-1H-benzotriazole $R^1$=Br $R^2$=Br
(Example 11)

The resulting slurry was filtered; the solid residue washed with water (100 mL) and the resulting solid was further purified by recrystallization from ethanol (30 mL). The product was dried for 24 h at 50° C. and 5 mbar and obtained as pale yellow solid. Yield: 83%.

$^1$H-NMR (500 MHz, $d_6$-DMSO) δ=8.45 (s, 2H, H-4, H-7) ppm.

MS (EI): m/z calcd. for $C_6H_3Br_2N_3$ 275. Found 275.

5-sec-butyl-1H-benzotriazole $R^1$=sec-Bu $R^2$=H
(Example 13)

To the resulting solution, water (70 mL) was added whereupon an oily phase separated from the solution. The oil was collected and the aqueous layer extracted with $CH_2Cl_2$ (3×30 mL). The combined organic layers were washed with a solution of sodium bicarbonate (15 wt % in water, 2×100 mL) and brine (10 mL), dried over magnesium sulfate, filtered and evaporated. The product was obtained as an off-white solid. Yield: 94%.

$^1$H-NMR (500 MHz, $d_6$-DMSO) δ=15.54 (brs, 1H, NH), 7.95-7.26 (m, 3H, H-4, H-7, H-6), 2.79 (m, 1H, CH), 1.63 (m, 2H, $CH_2$), 1.26 (d, J=6.9 Hz, 3H, $CH_3$), 0.78 (t, J=14.7 Hz, 3H, $CH_3$) ppm.

Due to tautomerism, each substituted BTA having a substitutent in 5-position includes the corresponding tautomer (corresponding substituted BTA having said substitutent in 6-position).

A mixture of 4- and 5-Methyl-1H-benzotriazole (Comparative Example 2) is commercially available e.g. from BASF SE as Irgamet™ TTZ.

5-chloro-1H-benzotriazole (Example 12) is commercially available.

4,5,6,7-Tetrahydro-1H-benzotriazole (Example 14) is commercially available e.g. from BASF SE as Irgamet™ SBT 75.

General Procedure for the 50 mm CMP Experiments

Several comparative CMP compositions (Comparative Examples 1-7) and CMP compositions according to the invention (Examples 8-14) were used for polishing high purity copper and tantalum disks of 50 mm (2 inch) diameter (received from Kamis) using a MetPrep 4™ table Grinding/Polishing machine from Allied Hightech.

down pressure: 1.9 psi (6 lbf);
polishing table/carrier speed: 150/110 rpm;
slurry flow rate: 120 ml/min;
time polishing step: 60 s;
polishing pad: Fujibo H800 NW;
pad conditioning (ex situ): pad is conditioned manually by several sweeps with a brush
rinse: 10 sec. water After polishing the disks are rinsed with de-ionized water for 30 seconds and dried with nitrogen gas.

For the determination of removal rates at least three disks are polished and the data obtained from these experiments are averaged.

The material removal rates (MRR) are determined by difference of weight of the blanket metal discs before and after polishing, using Mettler Toledo XP 205 DeltaRange scale. The difference of weight can be converted into the difference of film thickness:

$$MRR = \frac{\Delta m}{\pi r^2 \times \rho \times t} [\text{Å/min}]$$

Density: 8.94 g/cm³ for copper
16.65 g/cm³ for tantalum
Surface area: 19.635 cm²
The results of the tests are given in the table 1 below.
Slurry Preparation:
Stock Solutions Since some chemicals do not dissolve easily in water, stock solutions are prepared in advance.

Corrosion inhibitor: 1 wt-% in water
Nonionic surfactant: 10 wt-% in water
alcohol: 10 wt-% in water
Buffer 25 wt-% in water
KOH: 10 wt-% in water
Preparation of 2.5 kg Slurry First 1500 g de-ionized water are added into a beaker, followed by the addition of 20 g malonic acid and the mixture is stirred until the acid is dissolved. KOH (10 wt-% in water) is added to adjust the pH to 7. Then 62.5 g corrosion inhibitor solution (1 wt-% in water), 160 g propylene glycol solution (10 wt-% in water), 2.5 g non-ionic surfactant solution (10 wt-% in water) are added. If present, 40 g potassium carbonate (25 wt-% in water) are added and pH adjusted to pH 11 by adding KOH (10 wt-% in water), followed by the slow addition of 250 g silica dispersion Fuso PL-3 (20 wt-% commercial product). KOH is added to readjust pH to 10.5, the remaining water is added to final weight 2400 g. The formulation is stirred for 15 min in a sealed beaker.

Prior to polishing, 100 g hydrogen peroxide (31 wt-%) is added to the formulation and stirred for 10 minutes.

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Corrosion inhibitor (A) | 1H-Benzotriazole (0.025 wt-%) | Mixture of 4- and 5-Methyl-1H-benzotriazole (0.025 wt-%) | 5-(Triflourmethyl) 1-H-benzotriazole (0.025 wt-%) | Benzotriazole-5-carboxylic acid (0.025 wt-%) | 5-Amino-benzotriazole (0.025 wt-%) | 5,6-Dimethyl-1H-benzotriazole (0.025 wt-%) | 5-Hydroxy-benzotriazole (0.025 wt-%) |
| Particles (B) | Fuso PL-3 (2 wt-%) | | | | | | |
| Complexing agent (C) | Malonic Acid (1 wt-%) | | | | | | |
| Surfactant (D) | Plurafac LF 401 (manufacturer: BASF SE) (alkoxylated, predominantly unbranched fatty alcohols which contain higher alkene oxides as well as ethylene oxide) (0.01 wt-%) | | | | | | |
| Alcohol (E) | Propylene glycol (0.65 wt-%) | | | | | | |
| Oxidizing agent (F) | $H_2O_2$ (1.24 wt. %) | | | | | | |
| pH adjustor (H) | Potassium hydroxide | | | | | | |
| pH | 9.9 | 9.9 | 9.9 | 9.9 | 9.9 | 9.9 | 9.9 |
| $MRR_{Ta}$ in Å/min | 515 | 510 | 510 | 522 | 509 | 512 | 584 |
| $MRR_{Cu}$ in Å/min | 227 | 210 | 439 | 490 | 175 | 153 | 322 |
| Selectivity $MRR_{Ta}/MRR_{Cu}$ | 2.4 | 2.4 | 1.2 | 1.1 | 2.9 | 3.3 | 1.8 |

|  | Example 8 | Example 9 | Example 10 | Example 11 | Example 12 | Example 13 | Example 14 |
|---|---|---|---|---|---|---|---|
| Corrosion inhibitor (A) | 5-Bromo-1H-benzotriazole (0.025 wt-%) | 5-tert-Butyl-1H-benzotriazole (0.025 wt-%) | 5-(Benzoyl)-1H-benzotriazole (0.025 wt-%) | 5,6-Dibromo-1H-benzotriazole (0.025 wt-%) | 5-Chloro-1H-Benzotriazole (0.025 wt-%) | 5-sec-butyl-benzotriazole (0.025 wt-%) | 4,5,6,7-Tetrahydro-1H-benzotriazole (0.025 wt-%) |
| Particles (B) | Fuso PL-3 (2 wt-%) | | | | | | |
| Complexing agent (C) | Malonic Acid (1 wt-%) | | | | | | |
| Surfactant (D) | Plurafac LF 401 (manufacturer: BASF SE, alkoxylated, predominantly unbranched fatty alcohols which contain higher alkene oxides as well as ethylene oxide) (0.01 wt-%) | | | | | | |
| Alcohol (E) | Propylene glycol (0.65 wt-%) | | | | | | |
| Oxidizing agent (F) | $H_2O_2$ (1.24 wt. %) | | | | | | |
| pH adjustor (H) | Potassium hydroxide | | | | | | |
| pH | 9.9 | 9.9 | 9.9 | 9.9 | 9.9 | 9.9 | 9.9 |
| $MRR_{Ta}$ in Å/min | 500 | 512 | 504 | 524 | 547 | 544 | 560 |
| $MRR_{Cu}$ in Å/min | 21 | <10 | 55 | 13 | <10 | 36 | 88 |
| Selectivity $MRR_{Ta}/MRR_{Cu}$ | ~24 | >50 | ~9 | >40 | >50 | >15 | 6.6 |

|  | Comparative Example 15 | Comparative Example 16 | Comparative Example 17 | Comparative Example 18 | Comparative Example 19 | Comparative Example 20 |
|---|---|---|---|---|---|---|
| Corrosion inhibitor (A) | 1H-benzotriazole (0.025 w %) | 5-Chloro-1H-Benzotriazole (0.025 w %) | 1H-benzotriazole (0.025 w %) | 5-Chloro-1H-Benzotriazole (0.025 w %) | 1H-benzotriazole (0.025 w %) | 1H-benzotriazole (0.025 w %) |
| Particles (B) | Fuso PL-3 (2 wt-%) | | | | | |
| Complexing agent (C) | Malonic Acid (1 wt-%) | | | | | |

-continued

| | | | | | | |
|---|---|---|---|---|---|---|
| Surfactant (D) | Plurafac LF 401 (manufacturer: BASF SE) (alkoxylated, predominantly unbranched fatty alcohols which contain higher alkene oxides as well as ethylene oxide) (0.01 wt-%) | | | | | |
| Alcohol (E) | Propylene glycol (0.65 wt-%) | | | | | |
| Oxidizing agent (F) | $H_2O_2$ (1.24 wt. %) | | | | | |
| pH adjustor (H) | Potassium hydroxide | | | | | |
| Ca-Additive | Calcium acetate (0.04%) | Calcium hydroxide (0.04%) | Calcium acetate (0.04%) | Calcium hydroxide (0.04%) | Calcium acetate (0.04%) | Calcium hydroxide (0.04%) |
| pH | 9.9 | 9.9 | 9.9 | 9.9 | 9.9 | 9.9 |
| $MRR_{Ta}$ in Å/min | | | | n.a. | | |
| $MRR_{Cu}$ in Å/min | | | | n.a. | | |
| Selectivity $MRR_{Ta}/MRR_{Cu}$ | | | | n.a. | | |
| Observation | Phase separation within 5 hours | Phase separation within 5 hours | Phase separation within 5 hours | Phase separation within 5 hours | Phase separation within 5 hours | Phase separation within 5 hours |

In contrast to the CMP compositions of comparative examples 1-7, in the above-described CMP experiments the CMP compositions of examples 8-14 according to the present invention exhibit (a) a material removal rate (MRR) of tantalum or tantalum nitride of 500 Å/min or more
and
(b) a material removal rate (MRR) of copper of 88 Å/min or less
and
(c) a selectivity for tantalum or tantalum nitride over copper with regard to the MRR of 6.6 or more.

In the CMP compositions of comparative examples 15-20 which contain calcium ions in a concentration exceeding the upper limit for the CMP compositions of the present invention (1 ppm based on the total weight of the respective CMP composition), a phase separation occurred within 5 hours. Thus, no polishing data could be obtained.

Stability Test 200 mL slurry of each example according to the invention (examples 8-14) were put in an oven and stored for 14 days at 60° C., pH and mean particle size were measured in dependence of the time pH: Knick Portamess 911xpH, electrode: Schott instruments Blue Line 28 pH Calibration: Bernd Kraft GmbH (pH4-Art. Nr. 03083.3000 and pH7-Art. Nr. 03086.3000)

MPS: Malvern Instruments GmbH, HPPS 5001

For the examples according to the invention (examples 8-14), no significant change of the particle size has been observed.

The invention claimed is:

1. A chemical-mechanical polishing (CMP) composition in the form of a ready to use slurry comprising:
(A) one or more compounds of formula (1):

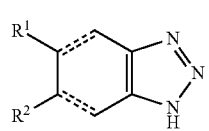

(1)

wherein the pairs of dashed lines in formula (1) either each represent a double bond or each represent a single bond, wherein
(i) when each pair of dashed lines in formula (1) represents a double bond then one of $R^1$ and $R^2$ is hydrogen and the other of $R^1$ and $R^2$ is selected from the group consisting of chlorine, bromine, alkyl with three to six carbon atoms, benzoyl and $-COOR^3$, wherein $R^3$ is selected from the group consisting of alkyls with three to six carbon atoms or $R^3$ is a substituent comprising a structural unit selected from the group consisting of $-(CH_2-CH_2-O)_n-H$ and $-(CH_2-CH_2-O)-CH_3$, wherein n in each case is an integer in the range of from 1 to 15, or $R^1$ and $R^2$ are both independently selected from the group consisting of bromine and chlorine, and
(ii) when each pair of dashed lines in formula (1) represents a single bond then $R^1$ and $R^2$ are hydrogen, or one of $R^1$ and $R^2$ is hydrogen and the other of $R^1$ and $R^2$ is selected from the group consisting of chlorine, bromine, alkyl with three to six carbon atoms, benzoyl and $-COOR^3$ wherein R3 is selected from the group consisting of alkyls with three to six carbon atoms or $R^3$ is a substituent comprising a structural unit selected from the group consisting of $-(CH_2-CH_2-O)_n-H$ and $-(CH_2-CH2-O)_n-CH_3$, wherein n in each case is an integer in the range of from 1 to 15, or $R^1$ and $R^2$ are both independently selected from the group consisting of bromine and chlorine; and
(B) between 0.002 wt % to 7 wt % of inorganic particles, organic particles, or a composite or mixture thereof, having an average sphericity ranging from 0.4 to 0.9 nm, an average primary particle size of 35 nm, and an average secondary particle size of 70 nm;
wherein the total amount of cations selected from the group consisting of magnesium and calcium is less than 1 ppm based on the total weight of the respective CMP composition;
wherein the total amount of said one or more compounds of formula (1) is in a range of from 0.0001% to 1 wt. % based on the total weight of the respective CMP composition, and the particles (B) are cocoon shaped; and
wherein the pH of the CMP composition ranges from 9.5 to 14.

2. The chemical-mechanical composition according to claim 1, wherein (A) the one or at least one of the more than one compounds of formula (1) is selected from the group consisting of:
5-bromo-1H-benzotriazole,
5-tert-butyl-1H-benzotriazole,
5-(benzoyl)-1H-benzotriazole,
5,6-dibromo-1H-benzotriazole,
5-chloro-1H-benzotriazole,
5-sec-butyl-1H-benzotriazole, and
4,5,6,7-tetrahydro-1H-benzotriazole.

3. The chemical-mechanical polishing (CMP) composition according to claim 1, wherein the particles of constituent (B) are particles selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, zirconia and mixtures and composites thereof.

4. The chemical-mechanical polishing (CMP) composition according to claim 1, further comprising
(C) one or more complexing agents selected from the group consisting of inorganic acids and their salts and organic acids and their salts.

5. The chemical-mechanical polishing (CMP) composition according to claim 1, further comprising
(D) one or more amphiphilic non-ionic surfactants.

6. The chemical-mechanical polishing (CMP) composition according to claim 1, further comprising
(E) one or more alcohols, wherein the total content of the alcohol is less than 0.8 wt % based on the total weight of the CMP composition.

7. The chemical-mechanical polishing (CMP) composition according to claim 1, further comprising
(F) one or more oxidizing agents.

8. The chemical-mechanical polishing (CMP) composition according to claim 1, further comprising
(I) one or more buffers.

9. The chemical-mechanical polishing (CMP) composition according to claim 1,
wherein the chemical-mechanical polishing composition is obtainable by
mixing (H), which is one or more pH adjusting agents, with the constituents (A), (B) and optionally one, more or all of constituents (C), (D), (E), (F) and (I) of the chemical-mechanical polishing composition, wherein
(C) is one or more complexing agents selected from the group consisting of inorganic acids and their salts and organic acids and their salts,
(D) is one or more amphiphilic non-ionic surfactants,
(E) is one or more alcohols, wherein the total content of the alcohol is less than 0.8 wt % based on the total weight of the CMP composition,
(F) is one or more oxidizing agents, and
(I) is one or more buffers.

10. The chemical-mechanical polishing (CMP) composition according to claim 1, comprising
(C) a total amount of one or more complexing agents selected from the group of organic acids and salts thereof in a range of from 0.001 to 10 wt.-% based on the total weight of the respective CMP composition, and/or
(D) a total amount of one or more non-ionic surfactants in a range of from 0.00001 to 10 wt.-% based on the total weight of the respective CMP composition,
and/or
(E) a total amount of one or more alcohols, wherein the total content of the alcohol is less than 0.8 wt % based on the total weight of the respective CMP composition,
and/or
(F) a total amount of one or more oxidizing agents in a range of from 0.01 to 20 wt.-% based on the total weight of the respective CMP composition,
and/or
(I) a total amount of one or more buffers in a range of from 0.001 to 10 wt.-% based on the total weight of the respective CMP composition.

11. The chemical-mechanical polishing (CMP) composition according to claim 1, wherein the CMP composition contains cations selected from the group consisting of magnesium and calcium in a total amount of less than 0.9 ppm based on the total weight of the respective CMP composition.

12. The chemical-mechanical polishing (CMP) composition according to claim 11, wherein the CMP composition is substantially free of cations selected from the group consisting of magnesium and calcium.

13. The chemical-mechanical polishing (CMP) composition according to claim 1, further comprising (E) one or more alcohols selected from the group consisting of ethanediol (ethylene glycol), propanediol (propylene glycol) and butanediol (butylene glycol).

14. The chemical-mechanical polishing (CMP) composition according to claim 1, further comprising at least one of:
(F) one or more oxidizing agents selected from the group consisting of peroxides, persulfates, perchlorates, perbromates, periodates and permanganates, and
(I) one or more buffers selected from the group consisting of potassium carbonate or potassium hydrogen carbonate.

15. A process for the manufacture of a semiconductor device comprising chemical mechanical polishing of a substrate in the presence of a chemical mechanical polishing (CMP) composition as defined in claim 1.

16. The process according to claim 15, wherein the substrate comprises a surface region consisting of tantalum or tantalum nitride or of a tantalum alloy and/or a surface region consisting of copper or of a copper alloy.

* * * * *

UNITED STATES PATENT AND TRADEMARK OFFICE
CERTIFICATE OF CORRECTION

PATENT NO. : 10,647,900 B2
APPLICATION NO. : 14/905703
DATED : May 12, 2020
INVENTOR(S) : Robert Reichardt et al.

It is certified that error appears in the above-identified patent and that said Letters Patent is hereby corrected as shown below:

In the Specification

In Column 1, Line 57, delete "(interlayer" and insert -- interlayer --.

In Column 2, Line 60, delete "M RRs." and insert -- MRRs. --.

In Column 8, Line 49, delete "foil" and insert -- foil. --.

In Column 9, Line 2, delete "Mxx" and insert -- $M_{XX}$ --,
    Line 3, delete "Myy" and insert -- $M_{YY}$ --,
    Line 4, delete "Mxy" and insert -- $M_{XY}$ --,
    Line 11, delete "particle" and insert -- particle. --.

In Column 10, Line 48, delete "glutanic" and insert -- glutamic --,
    Line 56, delete "glutamin," and insert -- glutamine, --,
    Line 57, delete "histidinw," and insert -- histidine, --,
    Line 58, delete "tryptophane," and insert -- tryptophan, --.

In Column 11, Line 34, delete "hdroyphilic" and insert -- hydrophilic --,
    Line 36, delete "nonionic" and insert -- non-ionic --,
    Line 40, delete "nonionic" and insert -- non-ionic --,
    Line 44, delete "nonionic" and insert -- non-ionic --.

In Column 12, Lines 48-49, delete "cycloalkylaryl groups" and insert -- cycloalkyl-aryl groups --.

In Column 14, Line 15, delete "CM P" and insert -- CMP --.

In Column 16, Line 31, delete "i e." and insert -- i.e. --.

Signed and Sealed this
Tenth Day of November, 2020

Andrei Iancu
*Director of the United States Patent and Trademark Office*

CERTIFICATE OF CORRECTION (continued)
U.S. Pat. No. 10,647,900 B2

In Column 20, Line 13, delete "composition." and insert -- composition, --,
    Line 28, delete "CM P" and insert -- CMP --,
    Line 35, delete "CM P" and insert -- CMP --.

In Column 23, Line 61, delete "175." and insert -- 175; --.

In Column 24, Line 21, delete "$C_6H_3Br_2N_3275$." and insert -- $C_6H_3Br_2N_3$ 275; --,
    Line 39, delete "substitutent" and insert -- substituent --,
    Lines 41-42, delete "substitutent" and insert -- substituent --,
    Line 51, delete "CM P" and insert -- CMP --,
    Line 65, delete "water" and insert -- water. --.

In Columns 25-26, Line 25 (approx.), delete "(Triflourmethyl) 1-H-" and insert -- (Trifluoromethyl) 1H- --,
    Line 45 (approx.), delete "Benzotriazole" and insert -- benzotriazole --,
    Line 65 (approx.), delete "Benzotriazole" and insert -- benzotriazole --,
    Line 65 (approx.), delete "Benzotriazole" and insert -- benzotriazole --.

In Column 26, Line 2, delete "Nonionic" and insert -- Non-ionic --,
    Line 5, delete "water" and insert -- water. --.

In Columns 27-28, Line 14 (approx.), delete "$MRR_{-Ta}$" and insert -- $MRR_{Ta}$ --.

In the Claims

In Column 28, Lines 22-23, Claim 1, delete "-($CH_2$-$CH_2$-O)-$CH_3$," and insert -- -($CH_2$-$CH_2$-O)$_n$-$CH_3$, --,
    Line 32, Claim 1, delete "R3" and insert -- $R^3$ --,
    Line 36, Claim 1, delete "-($CH_2$-CH2-O)$_n$" and insert -- -($CH_2$-$CH_2$-O)$_n$ --,
    Line 57, Claim 2, delete "composition" and insert -- polishing (CMP) composition --.

In Column 30, Lines 36-37, Claim 14, delete "per-bromates," and insert -- perbromates, --.